(12) United States Patent  
Shao et al.

(10) Patent No.: US 8,685,798 B2
(45) Date of Patent: Apr. 1, 2014

(54) METHODS FOR FORMING THROUGH VIAS

(71) Applicant: Taiwan Semiconductor Manufacting Company, Ltd., Hsin-Chu (TW)

(72) Inventors: Tung-Liang Shao, Hsin-Chu (TW); Chih-Hang Tung, Hsin-Chu (TW); Chen-Hua Yu, Hsin-Chu (TW); Hao-Yi Tsai, Hsin-Chu (TW); Mirng-Ji Lii, Sinpu Township (TW); Da-Yuan Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/918,767

(22) Filed: Jun. 14, 2013

(65) Prior Publication Data

US 2013/0273698 A1 Oct. 17, 2013

Related U.S. Application Data

(62) Division of application No. 13/178,345, filed on Jul. 7, 2011, now Pat. No. 8,476,770.

(51) Int. Cl.
*H01L 21/302* (2006.01)

(52) U.S. Cl.
USPC .......................................... 438/128

(58) Field of Classification Search
USPC .......................................... 438/667, 128, 598
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,607,938 B2 | 8/2003 | Kwon et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,785 B2 | 6/2005 | Kim |
| 6,924,551 B2 | 8/2005 | Rumer et al. |
| 6,946,384 B2 | 9/2005 | Kloster et al. |
| 6,975,016 B2 | 12/2005 | Kellar et al. |

(Continued)

*Primary Examiner* — Thao Le

(74) *Attorney, Agent, or Firm* — Slater & Matsil, L.L.P.

(57) ABSTRACT

Methods for forming through vias in an integrated circuit package are disclosed. A substrate having a first surface is covered with an encapsulation layer of uncured material; the method includes inserting an upper mold tool having a first plurality of pillars into the encapsulation layer to imprint through vias extending to the first surface of the substrate; curing the encapsulation layer and the through vias; removing the upper mold tool from the encapsulation layer; and disposing conductor material within the through vias to make electrical connectors within the through vias. In additional methods, a method for forming an encapsulation layer using an upper and lower mold tool to form through vias and a mold cavity is disclosed.

20 Claims, 14 Drawing Sheets

(56) References Cited

U.S. PATENT DOCUMENTS

| | | | | |
|---|---|---|---|---|
| 7,037,804 | B2 | 5/2006 | Kellar et al. | |
| 7,056,807 | B2 | 6/2006 | Kellar et al. | |
| 7,157,787 | B2 | 1/2007 | Kim et al. | |
| 7,215,033 | B2 | 5/2007 | Lee et al. | |
| 7,271,482 | B2 * | 9/2007 | Kirby | 257/736 |
| 7,276,799 | B2 | 10/2007 | Lee et al. | |
| 7,279,795 | B2 | 10/2007 | Periaman et al. | |
| 7,300,857 | B2 * | 11/2007 | Akram et al. | 438/459 |
| 7,307,005 | B2 | 12/2007 | Kobrinsky et al. | |
| 7,317,256 | B2 | 1/2008 | Williams et al. | |
| 7,320,928 | B2 | 1/2008 | Kloster et al. | |
| 7,345,350 | B2 | 3/2008 | Sinha | |
| 7,402,515 | B2 | 7/2008 | Arana et al. | |
| 7,410,884 | B2 | 8/2008 | Ramanathan et al. | |
| 7,432,592 | B2 | 10/2008 | Shi et al. | |
| 7,494,845 | B2 | 2/2009 | Hwang et al. | |
| 7,528,494 | B2 | 5/2009 | Furukawa et al. | |
| 7,531,890 | B2 | 5/2009 | Kim | |
| 7,557,597 | B2 | 7/2009 | Anderson et al. | |
| 7,576,435 | B2 | 8/2009 | Chao | |
| 7,834,450 | B2 | 11/2010 | Kang | |
| 7,989,263 | B2 * | 8/2011 | Kramer et al. | 438/108 |
| 8,361,901 | B2 * | 1/2013 | Vick et al. | 438/667 |
| 8,563,438 | B2 * | 10/2013 | Maekawa | 438/720 |
| 2008/0164638 | A1 * | 7/2008 | Zhang | 264/500 |
| 2010/0247698 | A1 * | 9/2010 | Zhang et al. | 425/149 |

* cited by examiner

METHODS FOR FORMING THROUGH VIAS

This application is a divisional of U.S. patent application Ser. No. 13/178,345, filed on Jul. 7, 2011, entitled "Apparatus and Methods for Forming Through Vias," which application is hereby incorporated herein by reference in its entirety.

BACKGROUND

A common requirement for advanced integrated circuits ("ICs") in semiconductor processes is the use of through vias. In integrated circuit packages, the through vias allow vertical connections between devices and either integrated circuits mounted on a substrate, or to the substrate itself. For stacked package arrangements, the connections may extend through the substrate and allow stacked devices to be coupled through vertical paths. Through silicon vias (TSVs) may extend vertically through an integrated circuit or substrate and pass entirely through the device with or without electrical connections to the device. The use of these packaging technologies allows stacking of similar or different integrated circuit devices to add components without increased board area, for example. Unpackaged components may be arranged to be stacked within a package. Alternatively, packaged devices may be stacked using through vias to vertically couple the devices.

Forming deep holes, such as through vias, or blind vias (vias that extend into, but not through, a layer) using photolithography and etching operations is difficult. The vias must be formed correctly in increasingly thick layers of material and then plugged, plated or otherwise filled with conductive materials. The use of conventional photoresist, pattern, and etch steps to form the vias requires complex chemical processes and may also pose additional process control challenges, defects due to non-uniform processing may occur. Many steps are needed to form the patterns. Chemicals are used in photolithographic processes which add expense and create environmental problems.

The through vias may be formed in a package mounted on a substrate. In an application, an integrated circuit may be mounted on a substrate. The integrated circuit may be a processor, DSP, memory, FLASH, EEPROM or other device and may be quite sophisticated, such as a "system on a chip" or "SoC" device, or may be a simple transceiver or memory device. The substrate may include some circuitry such as redistribution metal layers, wire traces, solder ball or bumps connections, pin grid arrays, or other board level connectors, and may include one or more other integrated circuits, or passive or active devices such as decoupling capacitors for example. Substrates may be made of BT resin or "green board", epoxy resin, ceramic, plastic, silicon, glass or other materials. In an increasingly common arrangement for stacked packaging, the substrate may in fact itself be an integrated circuit, or a silicon substrate having passive or active circuitry formed within it. Alternatively, the substrate may be a blank wafer or a silicon or other semiconductor substrate.

As sophisticated electronic devices continue to become smaller and often are provided in portable, battery powered forms, such as tablet computers, PDAs, and smart phones, circuit board area and board size become more critical. The increased use of stacking and vertical packaging arrangements is therefore continuing and accelerating in industry. This increase in vertical integration of devices makes through via connections more important and more prevalent, and thus there is an increasing need to form these connections in a high yield, low cost, robust and efficient manner.

A continuing need thus exists for through via connection equipment and methods that overcome the disadvantages of the prior art approaches.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus embodiments for forming a packaged device including through vias extending through an encapsulation layer. In some embodiments, blind vias coupling to an integrated circuit covered by the encapsulation layer are formed. In additional embodiments, mold tools are provided for use in equipment similar to a molding tool for packaging integrated circuits to perform a novel imprinting process. Method embodiments for forming through vias and blind vias are provided using the novel imprinting process.

Figure 1:
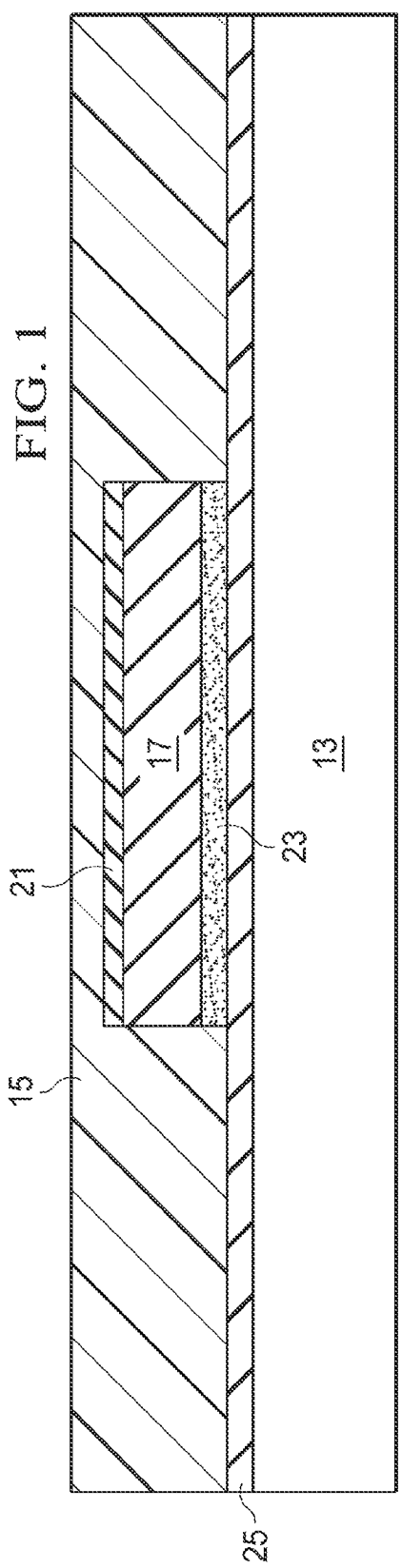
FIG. 1 depicts in a cross-sectional view a substrate and integrated circuit for use with an embodiment.

In FIG. 1, an integrated circuit die 17 is shown mounted face up and "back to face" on the face of a substrate 13. The substrate 13 is covered by a layer 25 which protects the surface of the substrate, for example, a passivation layer. An adhesive layer 23 such as a die attach or other adhesive secures integrated circuit die 17 to the substrate 13. A second protective layer 21, which may be the same material as layer 25, protects the face of integrated circuit die 17. This layer 21 may be a passivation layer or other dielectric layer as is known in the art. Encapsulation layer 15 is disposed over the face of substrate 13 and has a thickness great enough to cover both the face of substrate 13 and the face of integrated circuit die 17. This thickness may be more than 10 microns, or more than 5 microns, for example. Depending on the thickness of the IC 17 and other factors, the encapsulation layer 15 may become much thicker, up to several hundred microns.

The material used for encapsulation layer 15 may be selected from several alternatives and each forms an alternative embodiment contemplated by the inventors and covered by the appended claims. Mold compounds such as thermosetting epoxy resin may be used, such as is used for packaging of integrated circuits. Fillers and hardeners or other modifiers may be added to increase thermal conductivity, hardness, flow rate, etc., of the mold compound. Other materials such as liquid epoxies, epoxy resins, dry films, spun on glass ("SOG"), spun on dielectric ("SOD"), plastics, polyimide, and the like may be used. Organic or inorganic materials may be used.

Figure 2:
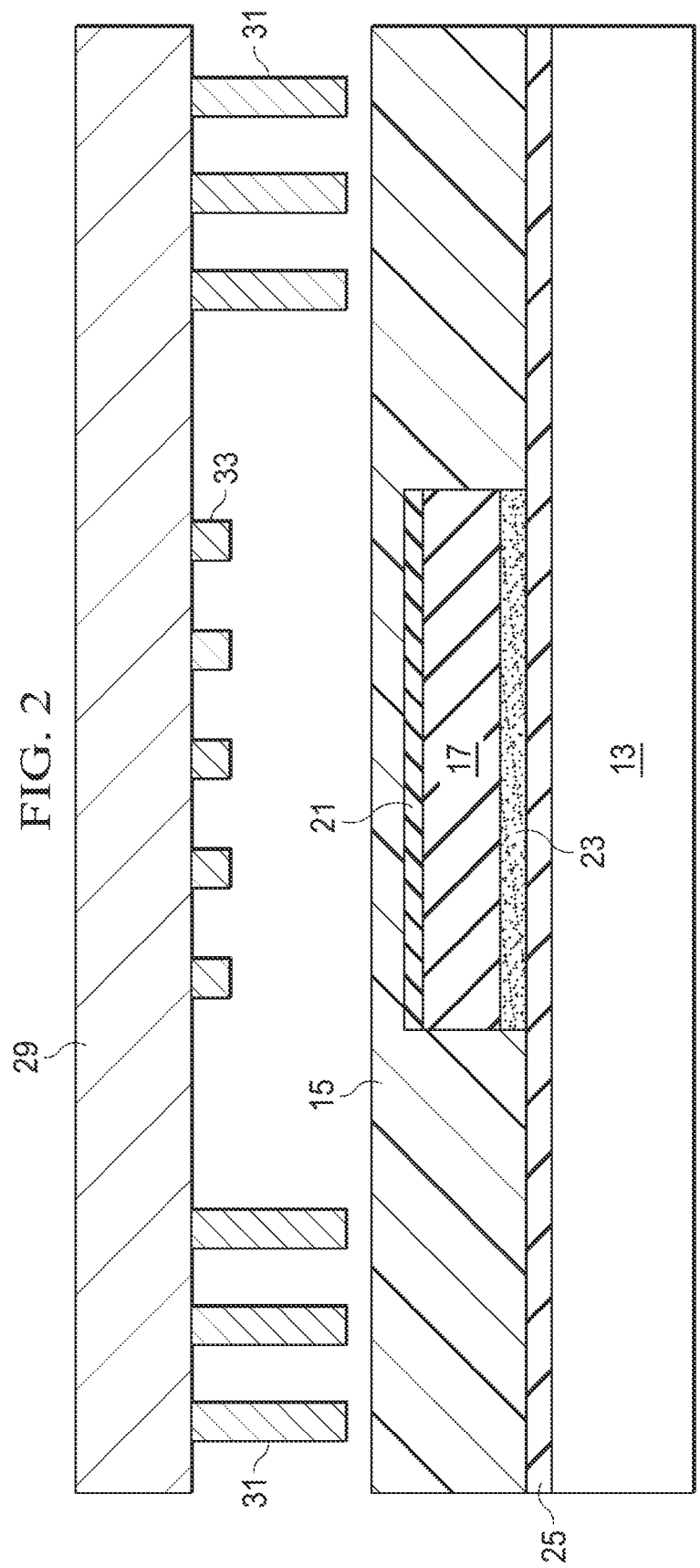
FIG. 2 depicts in a cross-sectional view an embodiment mold tool and the substrate of FIG. 1 in a processing step.

FIG. 2 illustrates, in a cross-sectional view, an upper mold tool 29 positioned over the substrate 13 including the encapsulation layer 15 and the integrated circuit die 17. The mold tool includes pillars 31 which are formed in a pattern that corresponds to the desired through vias to be formed. Pillars 33 are formed in the die portion of the mold tool, and these shorter pillars correspond to vias to be formed in the layer 15 extending to the face of the integrated circuit die 17 These are "blind vias" that do not extend through the encapsulation layer, but extend only to the face of the IC 17. Note that while only one substrate and IC combination, and one upper mold tool are depicted in FIG. 2, parallel processing, where multiple devices are imprinted in parallel is possible by providing a strip or array of devices for processing, and providing multiple upper mold tools; this is similar to the use of conventional molding equipment tools known in the art. Wafer level processing (WLP) is also possible using the embodiments. Further, more than one IC 17 may be mounted on the substrate 13 and additional blind vias formed over those ICs. For simplicity, in the explanatory embodiment of FIG. 2, only one IC 17 is depicted over a single substrate.

The upper mold tool 29 may be made of a material suitable for the mold compounds selected. The tool material should be selected to have a long life and be compatible with the temperatures used in curing, for example. Steel, stainless steel, alloys and other metals used in IC molding equipment are suitable. Coatings may be used to aid in mold release and durability.

Figure 3:
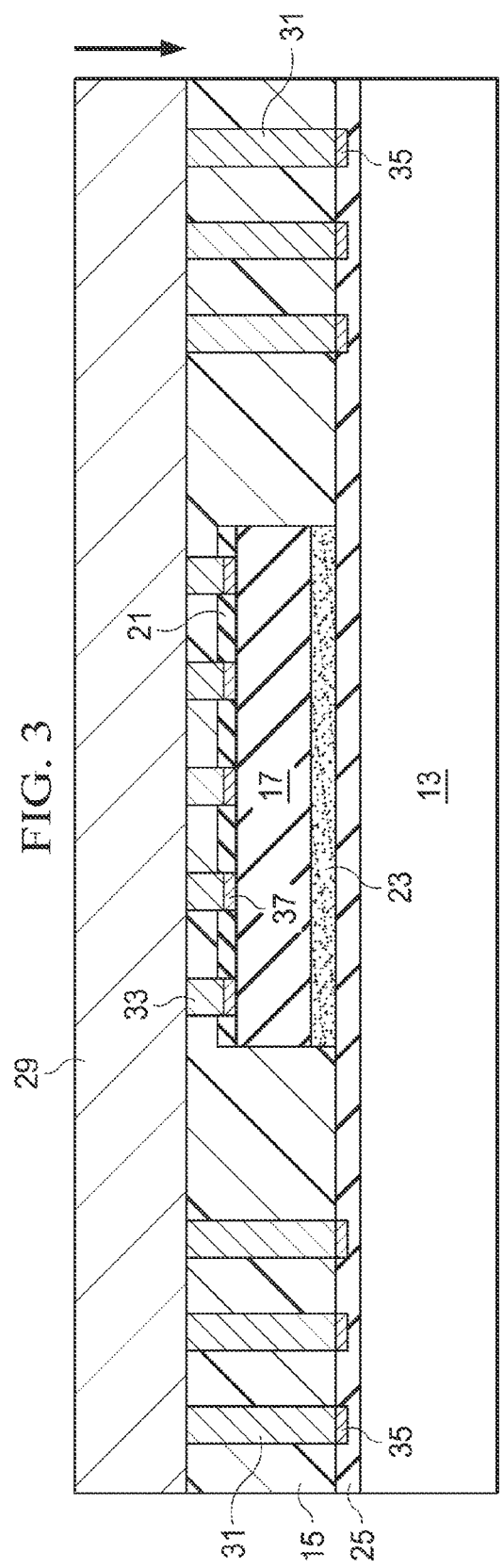
FIG. 3 depicts in a cross-sectional view the mold tool and substrate of FIG. 2 following an additional processing step.

In FIG. 3, a cross-section of the upper mold tool 29, substrate 13, IC 17 and encapsulation layer 15 are shown during the via imprinting process. As indicated by the arrow showing movement in FIG. 3, the upper mold tool is forced into the encapsulation material 15 which has not been cured at this stage in the process. The pillars 31 and 33 form vertical openings, that is, the through vias and blind vias, in the encapsulation material 15 as they are forced into and displace the softer encapsulation material. Pillars 31 extend through the encapsulation layer to the surface of substrate 13 and are aligned with bond pads or connectors 35 on the surface of the substrate 13. Similarly, pillars 33 extend into the encapsulation layer 15 and are aligned with bond pad or terminal connectors 37 on the surface of the integrated circuit die 17, and will form blind vias.

The encapsulation layer 15 may be one of several alternative materials. As described above, in alternative embodiments, the encapsulation layer 15 may be formed of mold compound, either thermoset or other similar mold compounds for integrated circuits, which may include fillers and hardeners as additives, spun on glass ("SOG"), spun on dielectric ("SOD"), polyimide, other organic or inorganic materials including thermoset mold compounds, room temperature liquid compounds for molding, and film materials.

After the upper mold tool 29 is inserted into the encapsulation layer 15, the encapsulation layer may be cured by exposure to increased temperatures using heat, or cured by exposure to heat from UV energy. Depending on the materials selected for the encapsulation layer, an appropriate time and temperature recipe are applied. For example, the recipe might range from 60-200 degrees C. and for from 5-60 minutes.

In yet another alternative embodiment, the use of a photosensitive material as the encapsulation layer 15 is also possible. However, in those embodiments, care must be taken to ensure proper exposure of the encapsulation layer 15 to the exposure light, as the thickness of this layer 15 may range from 5 to several hundred microns. At the larger thicknesses of this layer 15, even exposure of the photosensitive materials forming the layer is difficult. Proper processing of a photosensitive layer as encapsulation layer 15 will require uniform exposure to develop the entire layer uniformly.

After curing, the pattern formed by the pillars 31, corresponding to the through vias, and pillars 33, corresponding to the blind vias, are permanently fixed in the encapsulation layer 15. The upper mold tool is then removed from the encapsulation layer. In order to facilitate the mold tool release, in some embodiments the pillars 31 and 33 have a tapered profile, wider at the interface with the planar surface of the upper mold tool and narrowing along the length of the pillars. In alternative embodiments, the pillars 31 and 33 and the upper mold tool 29 may be coated with a non-stick coating, such as Teflon or similar coatings. Both tapered pillars and non-stick coatings may be used together, or separately, in alternative embodiments.

Figure 4:
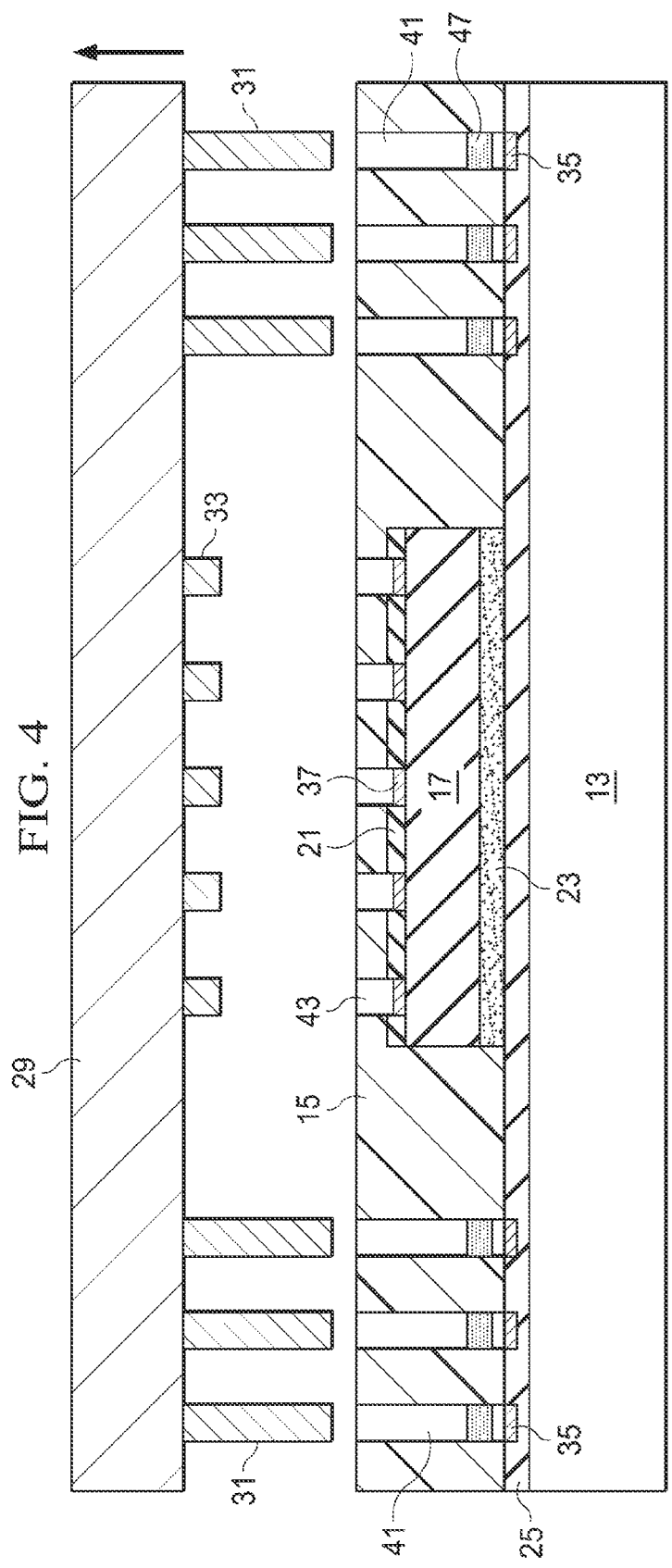
FIG. 4 depicts in a cross-sectional view the mold tool and substrate of FIG. 3 following an additional processing step.

FIG. 4 is a cross-sectional view illustrating the substrate 13, encapsulation layer 15 and IC 17, and the release process. As the upper mold tool 29 is removed from layer 15, through vias 41 are now formed and their locations correspond to bond pads or connection terminals 35 disposed on the surface of the substrate. Blind vias 43 are similarly formed over the integrated circuit die 17 and their locations correspond to at least some of the bond pads 47 on the IC 17. The encapsulation layer 15 may be in a range from 5 to 500 microns thick. The imprinting process may leave some encapsulation residue in the vias; this is shown as element 47 in FIG. 4. This residue may not be formed in all of the vias 41 and 43, but any residue needs to be removed. In an embodiment, a dry etch process is used to remove the residue. Other methods for residue removal such as wet etch or cleaning processes may be used.

Figure 5:
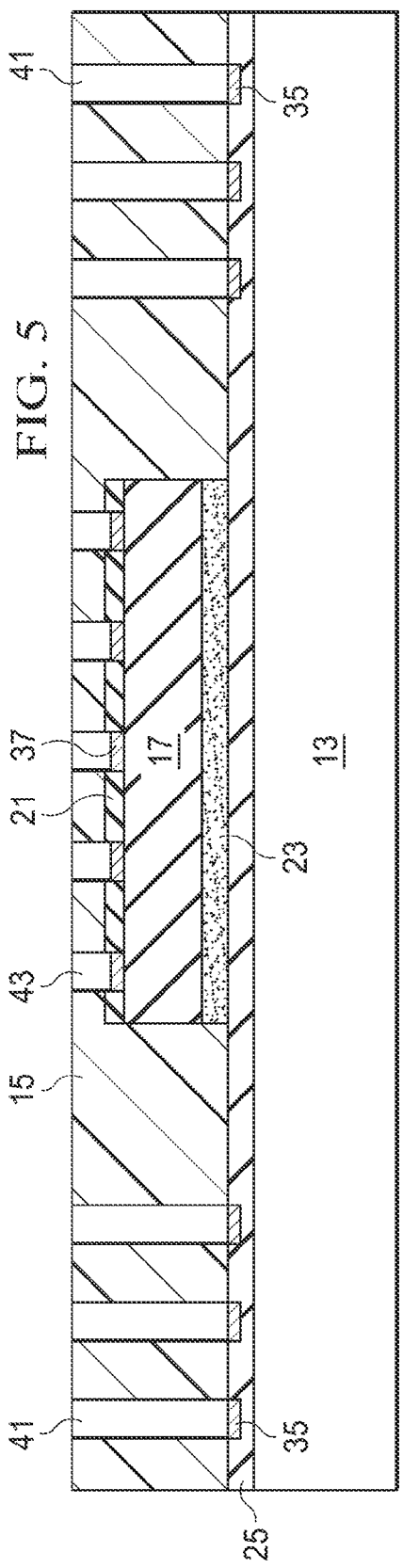
FIG. 5 depicts in a cross-sectional view the substrate of FIG. 4 following additional processing steps.

FIG. 5 illustrates, in a cross-sectional view, the substrate 13, the encapsulation layer 15, the IC 17, and the completed vias 41 and 43 after the residue is removed. Next, the through vias 41 and blind vias 43 are filled with conductor material to complete the vertical conductors for the vias. A plating seed layer may be deposited, such as by sputtering, in the vias. After the seed layer is deposited, an electroplating process may be used to form the conductors in and filling the vias.

Copper conductors may be used, or in alternative embodiments, other conductive via filling materials may be used, and alloys may be used. Electroless chemical plating could be used as an alternative. After the through vias and blind vias are completed with conductor material filling the vias, additional processing may be performed. External connectors for forming board connections to the substrate 13 and IC 17 are added. Solder balls, solder bumps, or column connectors such as controlled collapsible chip connections ("C4") connectors may be formed and coupled to the through vias. These external connectors are non-limiting examples and other connectors, such as pins or studs, may be used.

Figure 6:
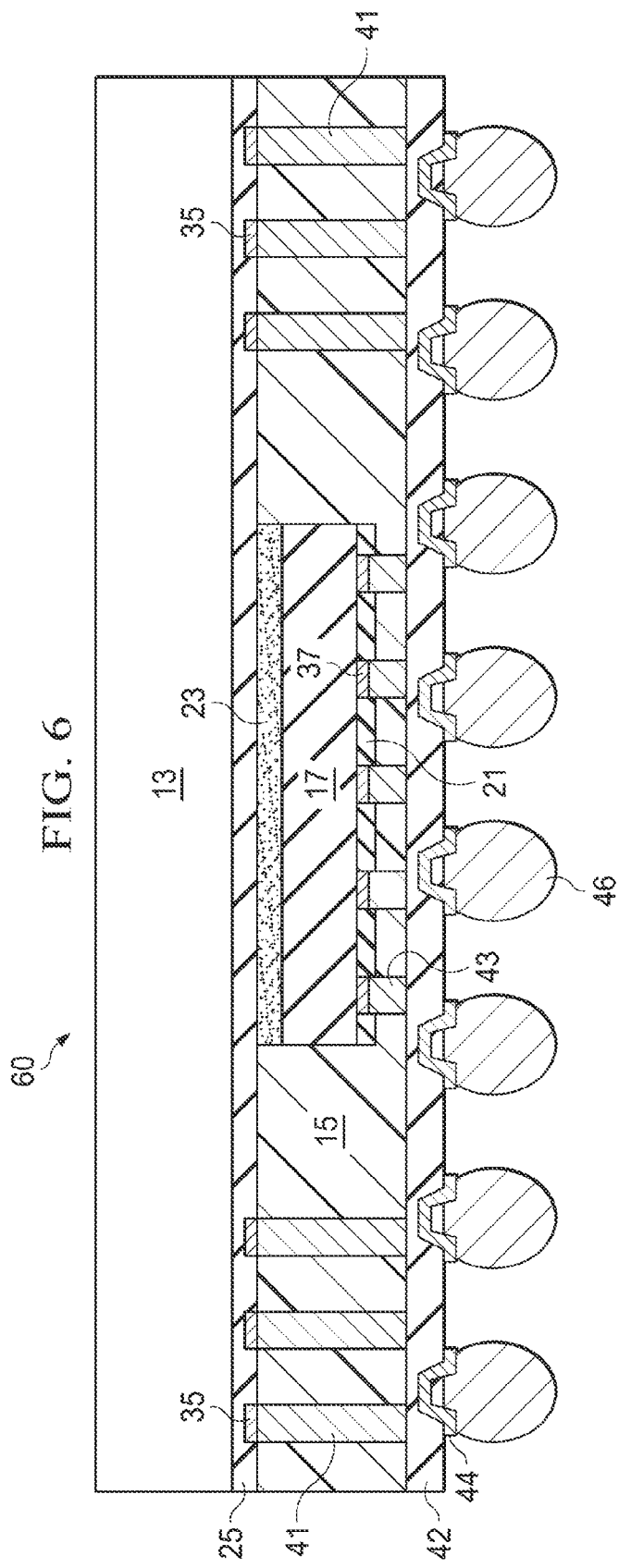
FIG. 6 depicts in a cross-sectional view an embodiment packaged device.

FIG. 6 depicts, in a cross-sectional view, a completed package 60 fabricated using the embodiments above. In this non-limiting example embodiment, the integrated circuit die 17 is mounted "back to face" to the face of substrate 13. (Note that the substrate 13 is now depicted "face down" while in the prior figures, the substrate 13 was shown "face up", where the face side is a substrate side that has bond pads or electrical terminals on it). In FIG. 6, a substrate 13 is shown having IC 17 attached to it by adhesive 23, which may be die attached. Passivation layer 25 is formed over the substrate 13, and bond pads 35 are shown on the surface of the substrate 13. The bond pads are conductors and may be formed of copper, gold, palladium, nickel, alloys of these, and other alloys including silver, tin and the like. An adhesion layer which provides improved coupling between dissimilar materials, and which acts as a diffusion barrier, may be provided on the bond pads. The use of the adhesion layer promotes coupling to other materials. Adhesion layers may include metals such as nickel, palladium, gold and alloys of these, including, without limitation, treatments known in the art such as electroless nickel, immersion gold (ENIG), electroless nickel, electroless palladium, immersion gold (ENEPIG). Encapsulation layer 15 has through vias 41; these are shown extending through the layer 15 and filled with a conductor. The vias 41 are in a correspondence to at least some of the bond pads 35 of the substrate and form vertical electrical connections to the substrate. Blind vias 43 are depicted formed in correspondence to the bond pads 37 of the IC 17 and filled with conductor material to form electrical connections to the IC 17.

In the embodiment illustrated in FIG. 6, the external connectors are solder balls, thus forming a ball grid array "BGA" package. Solder balls 46 are shown disposed over the encapsulation layer 15. The solder balls may be C4 bumps, solder balls, including lead based or lead-free bumps or balls, as are known in the art for IC package connections. In an alternative embodiment, under bump metallization (UBM) 44 may also be used is used to improve adhesion of the solder balls. A passivation layer 42 is shown over the encapsulation layer 15. Using the embodiment methods, the completed BGA packaged IC 60 is completed in a few steps: the through vias and blind vias are simultaneously formed in a simple imprinting process, and the remaining seed layer sputtering, via fill, and ball formation steps are formed using conventional approaches. Further, as will be described below, in embodiments where the IC 17 is not yet embedded, an encapsulation substrate may be formed with through vias, blind vias, and a die cavity in a single imprinting process.

Figure 7:
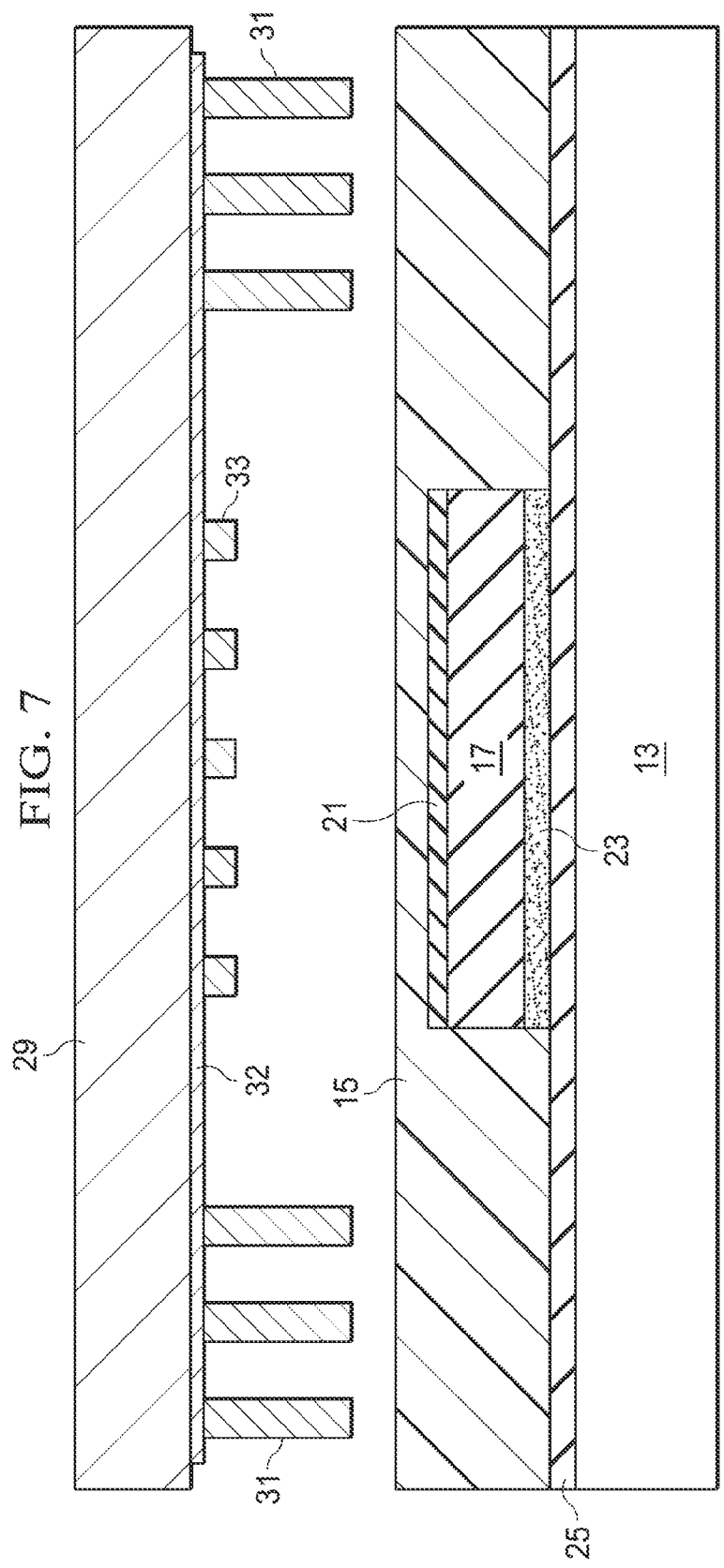
FIG. 7 depicts in a cross-sectional view an alternative embodiment mold tool with a substrate in a processing step.

FIG. 7 depicts, in a cross-section, an alternative embodiment upper mold tool 29. In this embodiment, mold tool 29 includes the pattern 32 to form a redistribution layer (RDL) pattern in the encapsulation layer, as well as the pillars 31 and 33 as described above. The RDL pattern, through vias, and blind vias are formed simultaneously using a relatively simple imprinting process.

In FIG. 7, the upper mold tool 29 is aligned with a substrate 13, which has a passivation layer 25, an IC 17 mounted back to face on the substrate, an encapsulation layer 15, and a passivation layer 21 over the IC 17. Bond pads are not shown for simplicity but are present at the upper or face surface of substrate 13, and on the face surface of IC 17, which is also positioned facing upward in this view as depicted in FIG. 7.

Figure 8:
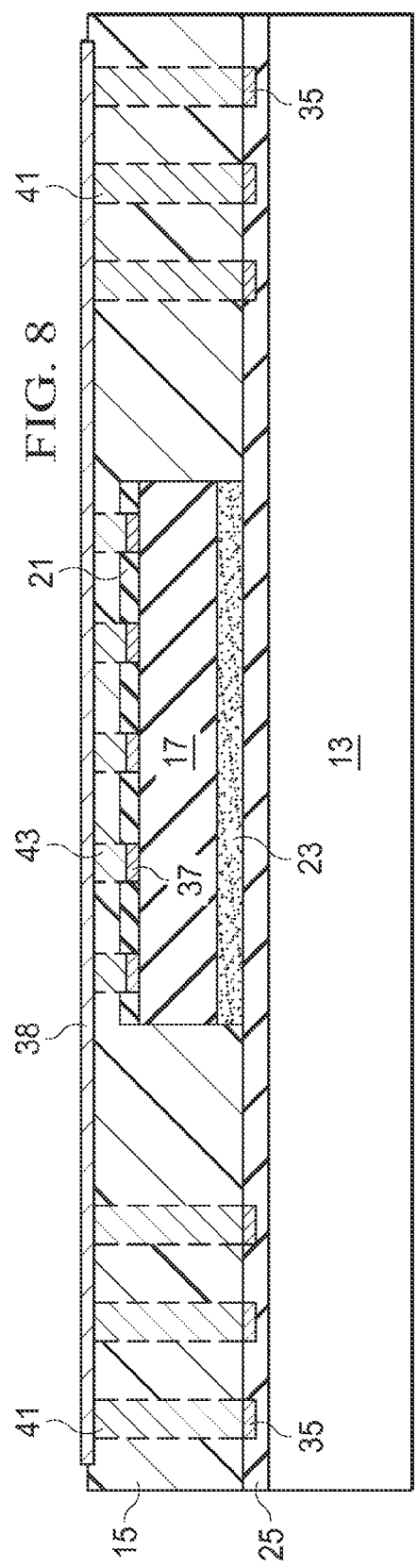
FIG. 8 depicts in a cross-sectional view the substrate of FIG. 7 following additional processing steps.

FIG. 8 depicts, in a cross-section, the substrate 13, IC 17 and encapsulation layer 15 after the upper mold tool of FIG. 7 is used in the imprinting process to form the RDL 38, the through vias 41, and the blind vias 43. The intermediate steps are similar to those described above for FIGS. 3-5. The upper mold tool is forced into the encapsulation layer and the pillars 31 and 33 (see FIG. 7), which correspond to the desired vias positions, are forced into and through (for the through vias) layer 15. Simultaneously, a pattern for the RDL material is formed at the upper portion of the encapsulation layer 15. By imprinting the upper mold tool patterns into the encapsulation layer, these elements are advantageously formed in a single imprinting process, in sharp contrast to the many steps that would be required using known photolithographic processing steps. The resulting redistribution pattern is shown as RDL 38 in FIG. 8. The through vias 41 and the blind vias 43 are shown in dashed patterns in the cross-section of FIG. 8, indicating that they are not in the same plane as the RDL 38. In alternative embodiments, some of the vias could be coupled to RDL 38 and could be in the same cross-sectional plane. The remaining components are the same as for FIG. 7 and the same reference numbers are used.

Figure 9:
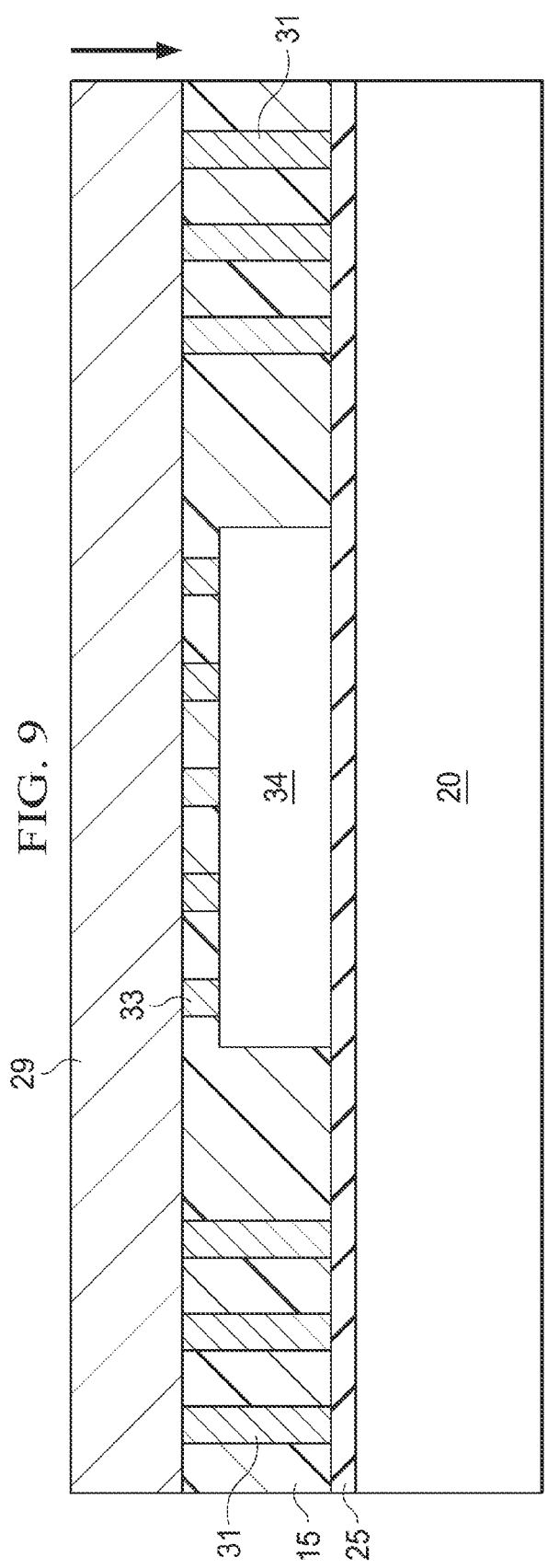
FIG. 9 depicts in a cross-sectional view an alternative embodiment mold tool in a processing step.

FIG. 9 depicts, in a cross-sectional view, an alternative embodiment mold tool. Upper mold tool 29 is now inserted into an encapsulation layer 15 simultaneously with a lower mold tool 20 and protruded cuboid form 34. The protruded cuboid form 34 will form a die cavity in the encapsulation layer 15. The encapsulation layer 15 will then form a package substrate ready for receiving an integrated circuit die; with the vias already completed.

Figure 10:
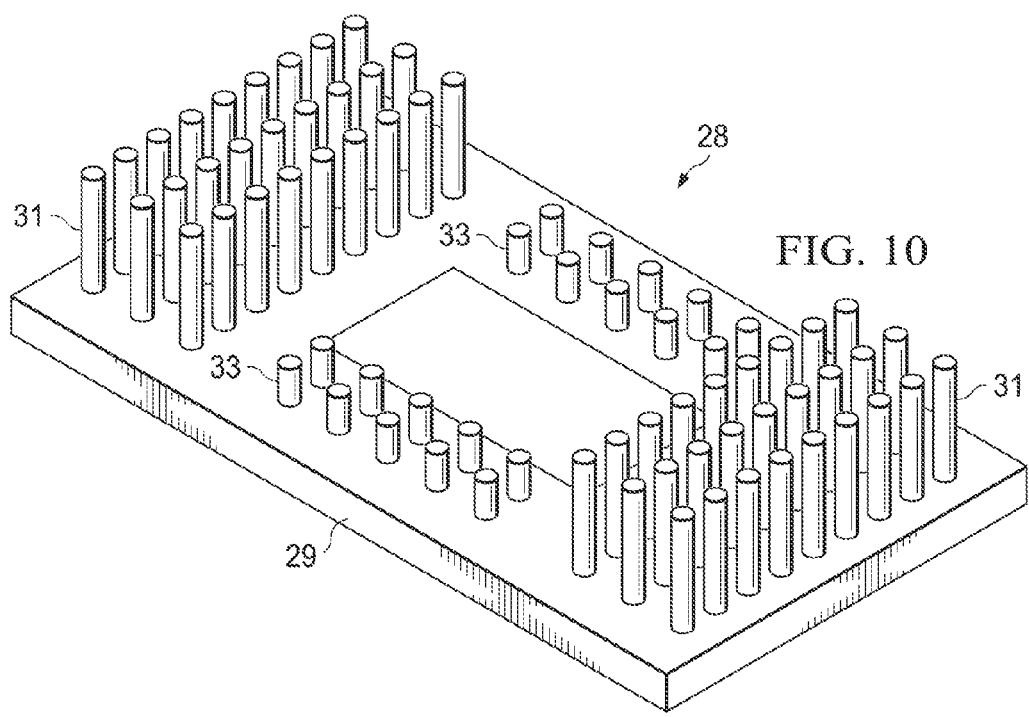
FIG. 10 depicts in a three dimensional view an embodiment upper mold tool.

FIG. 10 depicts, in a three dimensional view, an example of an upper mold apparatus embodiment 28. The upper mold tool 29 has pillars 31 extending from a planar surface of mold tool 29 and forming a pattern corresponding to the desired pattern of through vias. Pillars 33 are shorter and form a pattern corresponding to the desired pattern of blind vias that will couple to an IC to be mounted in the encapsulation layer.

Figure 11:
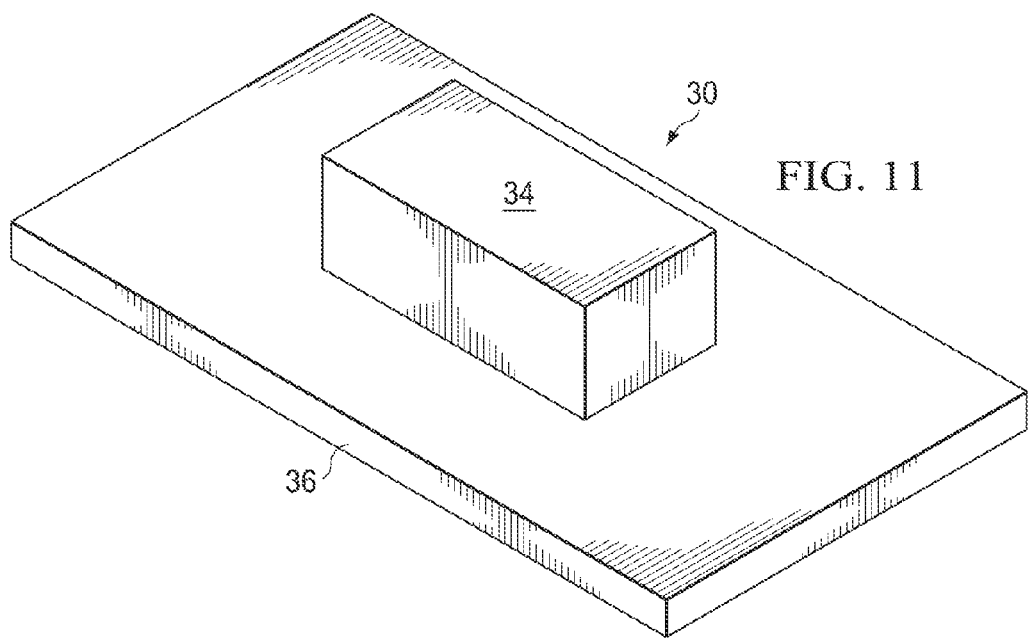
FIG. 11 depicts in a three dimensional view an embodiment lower mold tool.

FIG. 11 depicts, in another three dimensional view, a lower mold tool embodiment 30. In FIG. 11, a lower mold tool 20 has a protruded cuboid form or block projection 34 extending from the surface. In embodiment, methods where the IC is not embedded on a substrate prior to the imprinting process, an encapsulation substrate may be formed having a die cavity. In this approach, the integrated circuit die may be mounted in the die cavity in a subsequent mounting step, after the imprinting process. One or more of the encapsulation substrates may be formed by providing an encapsulation layer into a mold tool. The upper mold 29 may be forced downward into the encapsulation layer, forming any or all of the through vias, the blind vias, and the optional RDL patterns needed for a particular package. Simultaneously, the lower mold tool 30 may be pushed into the encapsulation layer from below, and the cuboid form 34 may form a die cavity in a central portion of the encapsulation layer, meeting the blind via pillars that will form blind vias to couple external connectors to the IC, which is mounted later. Following the imprinting process, a cure is performed, and then the upper and lower mold tools are removed from the cured encapsulation layer in a release step. The residue is removed from the vias, and a seed layer sputtering, and a plating process, may be used to fill the vias with conductor material, as described above. The integrated circuits and substrates may be assembled with the encapsulation layer to complete the device, and solder balls or bumps may be formed to form a completed packaged device. A gang or array approach may be used to form multiple encapsulation layers components simultaneously. In an alternative embodiment method, wafer scale processing may be used to form the encapsulation layer for the devices on an entire wafer substrate simultaneously.

Figure 12:
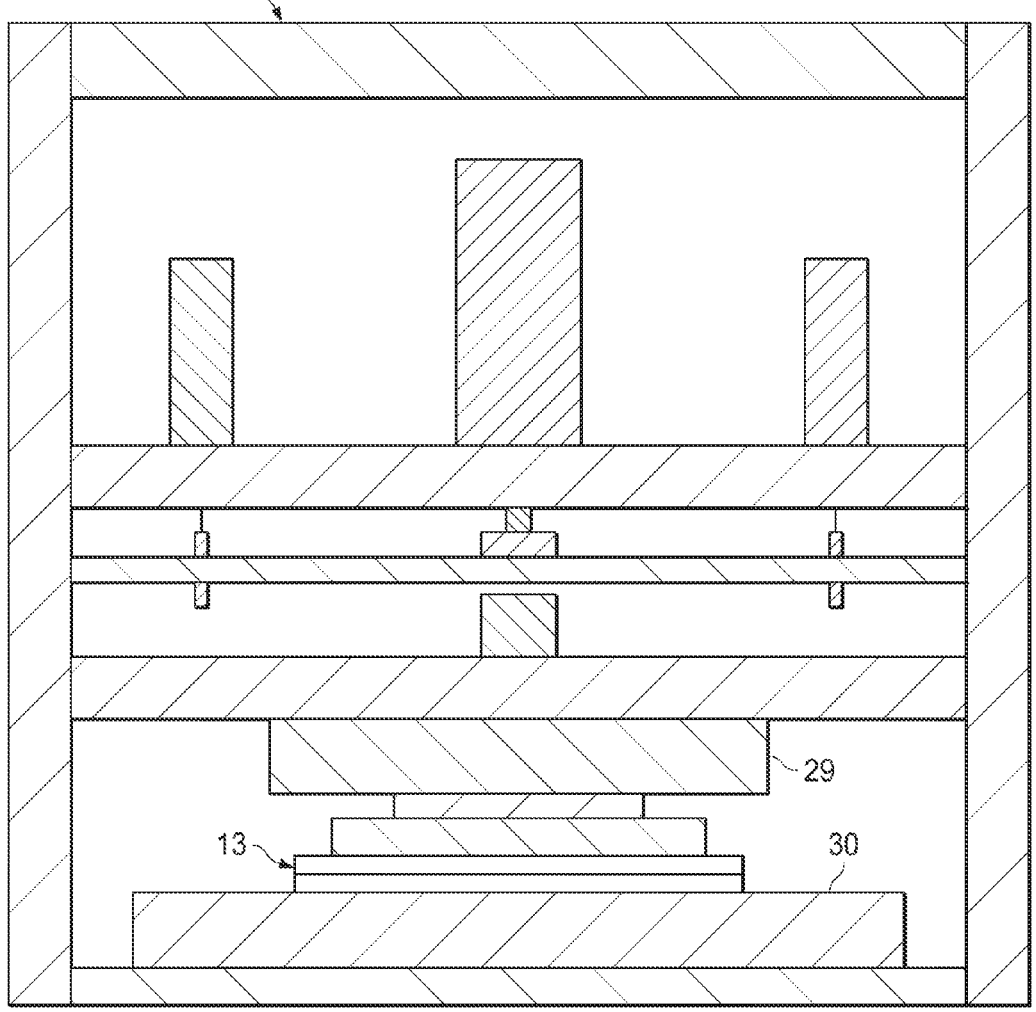
FIG. 12 depicts in a cross-sectional view a molding machine for use with the embodiments.

FIG. 12 depicts, in a simplified cross-section, a mold tool 81 that might be used to perform the imprinting process. The upper mold tool 29 and the lower mold tool 30 are arranged so that they may be moved together to force the pillars, and the cuboid 34, if used, together to imprint the pattern into the encapsulation layer as described above. The tool 81 can be opened to release the mold tools from the cured encapsulation layer. The substrate 13 is placed between the upper and lower mold tools and the encapsulation layer (not visible) is inside the tool.

In one alternative embodiment, a mold tool may be provided by modifying an existing transfer molding tool for IC packaging that uses hydraulic force to press mold compound into a mold while clamping the upper and lower parts together. The upper and lower mold tools may include runners and vents to allow excess encapsulation material to be forced into, and out of, the tool as needed, during the imprinting process. Note that in the embedded IC embodiments, as described above, the IC is already mounted on the substrate prior to encapsulation and via formation, and so the die cavity cuboid is not needed. If the IC is to be mounted later, then in those embodiments, the lower mold tool or upper mold tool may include the die cavity cuboid to form the die cavity in the encapsulation layer, and encapsulation substrates may be formed with die cavities for receiving dies in a later mounting process.

Figure 13:
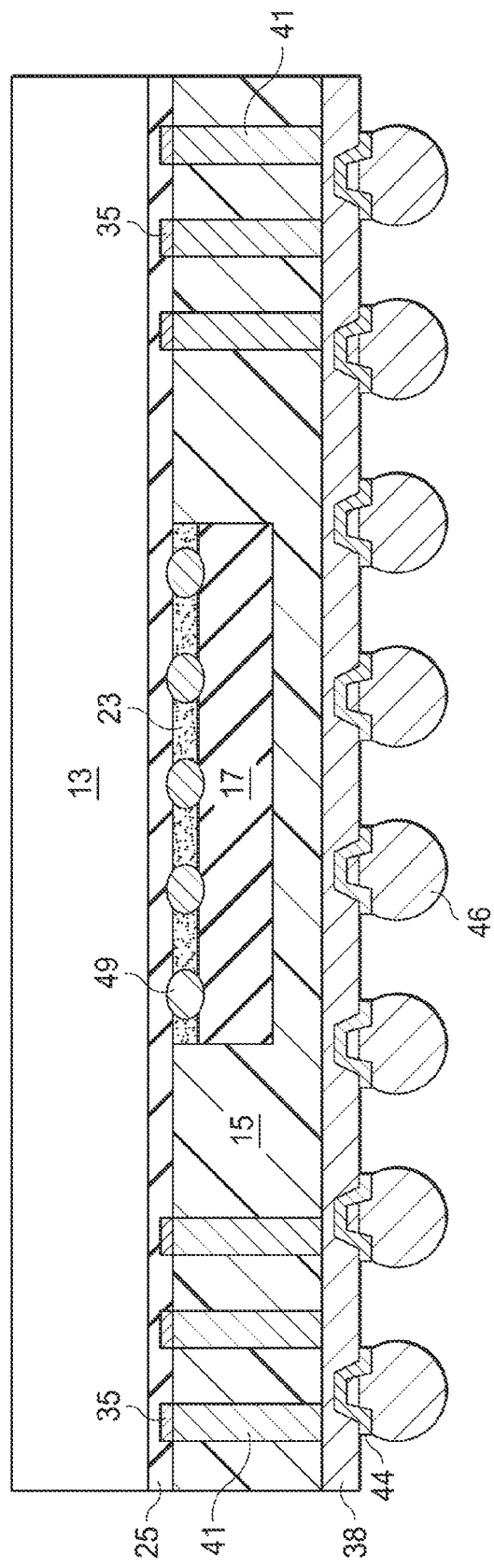
FIG. 13 depicts in a cross-sectional view an alternative packaged device embodiment.

FIG. 13 depicts, in an embodiment, an alternative package arrangement that may be provided using the method embodiments described herein. In FIG. 12, the integrated circuit die 17 is shown mounted "face to face" to substrate 13. Electrical connection between the IC 17 and the substrate 13 may be provided by micro-bumps 49, for example. Adhesive 23 is used to mount the IC 17. Substrate 13 is then coupled to one or more solder balls 46. An optional redistribution layer 38 is shown formed on the encapsulation layer 15. Through vias 41 are shown coupling the solder balls or other external connectors to the bond pads 35 of substrate 13. As described above, the through vias 41 and the RDL 38 may be formed in the encapsulation layer using the imprinting process, curing the encapsulation layer, releasing the mold tools from the encapsulation layer, optionally etching any residue from the through vias, sputtering a seed layer, forming conductor material in the through vias 41 and RDL 38 using, for example, electroplated copper or alloys, and forming solder ball or bump connections over the encapsulation layer. The through vias in this embodiment provide vertical connection between the solder balls and the substrate 13, but not to the IC 17, which is coupled to the substrate.

Figure 14:
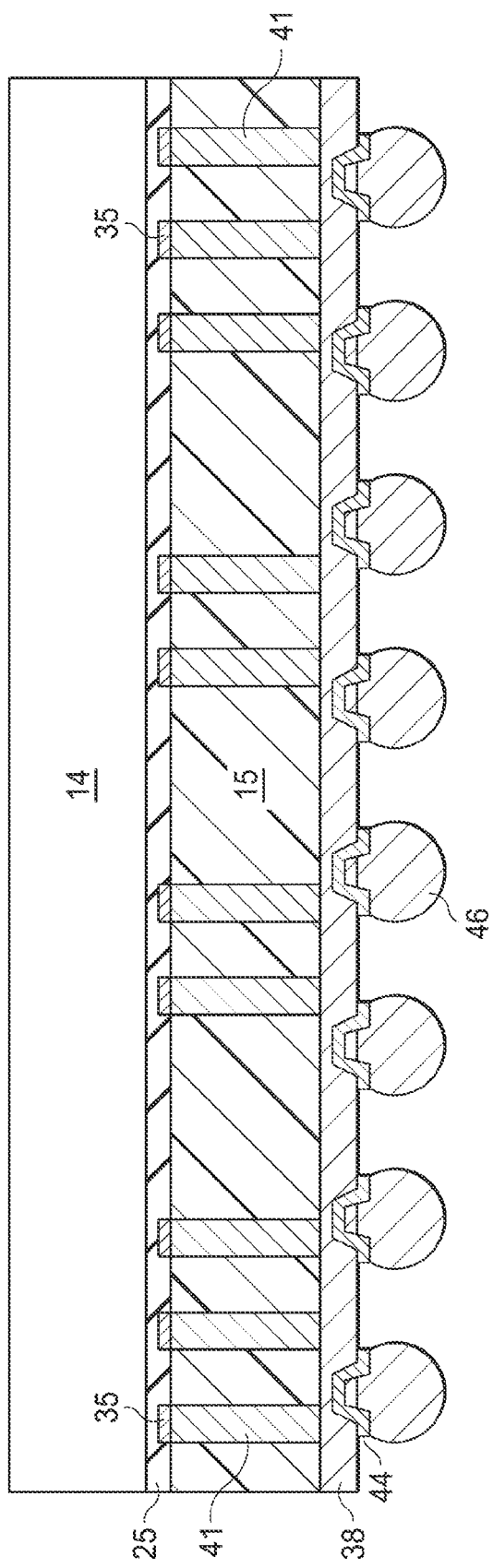
FIG. 14 depicts in a cross-sectional view another alternative packaged device embodiment.

FIG. 14 depicts, in a cross-sectional view, a single IC alternative embodiment. As described above, the imprinting process enables simple formation of the through vias extending through an encapsulation layer over a substrate. As described above, the substrate may in fact be an integrated circuit. In FIG. 13, the substrate 14 is an integrated circuit and the packaged device is formed using the imprinting method embodiments described above. Encapsulation layer 15 has through vias 41 extending through the layer. Conductive material fills the through vias to form electrical connection to the bond pads 35 of IC 14. Solder balls or C4 bumps or other connectors are formed over the encapsulation layer 15. RDL 38 provides a redistribution layer.

The package depicted in FIG. 14 may be formed using the embodiments described above. An upper mold tool is provided with pillars patterned to form the desired through vias. The location of the through vias corresponds to the bond pads of the IC 14 to be packaged. The encapsulation layer 15 is formed over the IC 14 but is not cured. The IC 14 is placed in a mold tool. The upper mold tool is forced into the encapsulation layer; the pillars form the through vias by displacing the encapsulation material. No die cavity is needed so the die cavity cuboid (See FIG. 10) is not used in this embodiment. The encapsulation layer 15 is cured, and the through vias are permanently formed. The upper mold tool is removed from the encapsulation layer in a release step. Residue is removed from the through vias by an etch process. A seed layer may be sputtered into the through vias, and electroplating may be used to fill the through vias using copper or another conductor in a plating process. If the optional RDL 38 is used, it too is filled with a conductor. Solder balls 46 are attached using an UBM material 44. In this manner, the single chip embodiment of FIG. 13 is formed using the imprinting processes.

Figure 15:
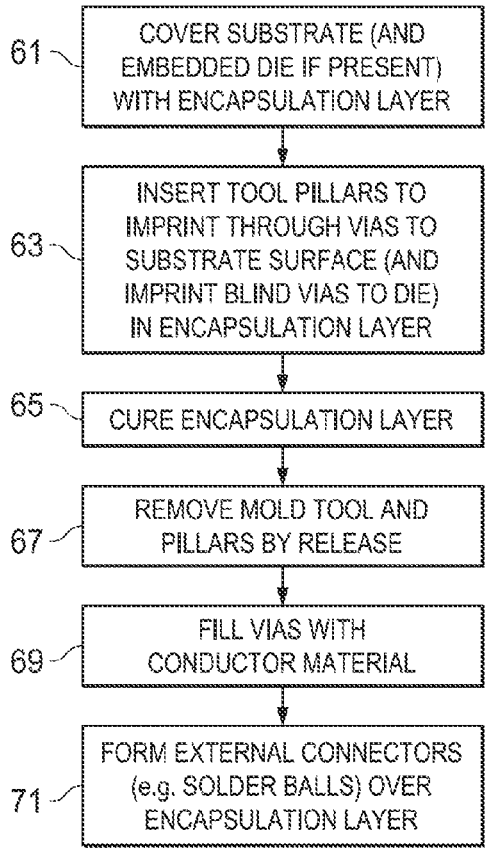
FIG. 15 is a flow diagram illustrating a method embodiment.

FIG. 15 illustrates, in a flow diagram, a method embodiment for forming the through vias using the imprinting process. In this embodiment, an embedded IC die may be provided mounted on a substrate, as shown in FIG. 2. Alternatively, the substrate may be an integrated circuit itself, as shown, for example, in FIG. 14. In step 61, the substrate and embedded die (if present) are covered with the encapsulation layer. In step 63, the imprinting process is performed by inserting the upper mold tool with the pillars to imprint through vias extending to the substrate face surface, and if the embedded die is present, blind vias are formed extending to the face of the embedded die.

In step 65, a cure process is performed. As described above the time and temperature for this cure step depend on the encapsulation materials chosen.

In step 67, the mold tool is removed from the encapsulation layer in a release process. As described above, the mold pillars may be tapered to aid in the release, and a non-stick coating may be applied to the pillars to aid in the release. A cleansing or etch is used to remove residue from the vias.

In step 69 of FIG. 15, the vias are now filled with a conductor material. In an embodiment, a seed layer is sputtered into the vias, and an electroplating process is performed. In an alternative embodiment electroless plating is used to chemically deposit the conductor material.

In step 71 of the method of FIG. 15, external connectors (such as BGA solder balls) are formed over the encapsulation layer and these may be coupled to the through vias or the blind vias. An optional redistribution layer, as described above, may be formed during the imprinting process, and filled with conductors to couple the solder balls to the vias, or to each other.

Figure 16:
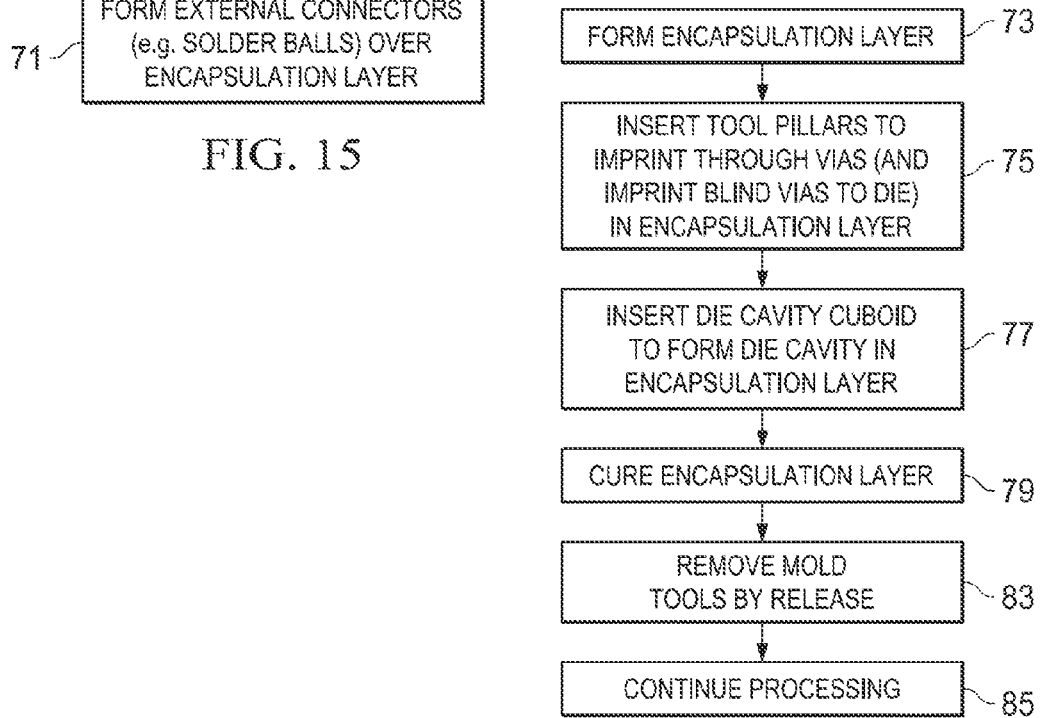
FIG. 16 is a flow diagram illustrating an alternative method embodiment.

FIG. 16 depicts, in a flow diagram, the steps for an alternative method embodiment. In FIG. 16, no embedded die is provided prior to the imprinting process. Instead a layer of encapsulation material is provided, and a die cavity will be formed to receive the die in a later step.

In step 73, the encapsulation layer is formed. In step 75, the pillars of the upper mold tool are inserted into the encapsulation layer to imprint the through vias and the blind vias into the encapsulation material. In step 77, the die cavity cuboid is inserted using a lower mold tool. This step may be performed contemporaneously with and even simultaneously with step

75; so the novel imprinting process forms the die cavity with the vias and if used, an RDL layer, in one simple process step.

In step 79, the encapsulation layer is cured. In step 83, the mold tools are then removed from the encapsulation layer, which forms an encapsulation substrate for use in later processing steps. This layer has the blind vias, through vias, die cavity and RDL pattern already formed in a single process step.

In step 85, the assembly process continues, using etch processes to remove residue, electroplating to form the conductor material and to fill the vias and the RDL pattern, and mounting the dies into the die cavities, to complete a package using the encapsulation layer.

In an embodiment, an apparatus comprises a substrate having one or more bond pad terminals for receiving electrical connections on at least one surface; an encapsulation layer covering the at least one surface of the substrate and having a first thickness; a plurality of through vias extending through the encapsulation layer and positioned in correspondence with at least one of the one or more bond pads; conductor material disposed within the plurality of through vias to form electrical connectors within the through vias; and at least one external terminal disposed on a surface of the encapsulation layer, electrically coupled to one of the one or more bond pad terminals by an electrical connector in at least one of the plurality of through vias. In an additional embodiment, an integrated circuit die is mounted on the at least one surface of the substrate and covered by the encapsulation layer. In a further embodiment, the integrated circuit die is mounted in a back to face orientation on the at least one surface of the substrate. In another embodiment, a plurality of blind vias are formed having the conductor material disposed within them, and extending through the encapsulation layer to a face surface of the integrated circuit.

In another alternative embodiment, an apparatus comprises a substrate having one or more bond pad terminals for receiving electrical connections on at least one surface; an encapsulation layer covering the at least one surface of the substrate and having a first thickness; a plurality of through vias extending through the encapsulation layer and positioned in correspondence with at least one of the one or more bond pads; conductor material disposed within the plurality of through vias to form electrical connectors within the through vias; and at least one external terminal disposed on a surface of the encapsulation layer, electrically coupled to one of the one or more bond pad terminals by an electrical connector in at least one of the plurality of through vias; wherein an integrated circuit is mounted in a face to face orientation on the substrate. In another embodiment, the substrate comprises an integrated circuit. In another embodiment, the substrate comprises a semiconductor material. In yet another embodiment, the substrate comprises silicon.

In an embodiment, an apparatus comprises a substrate having one or more bond pad terminals for receiving electrical connections on at least one surface; an encapsulation layer covering the at least one surface of the substrate and having a first thickness; a plurality of through vias extending through the encapsulation layer and positioned in correspondence with at least one of the one or more bond pads; conductor material disposed within the plurality of through vias to form electrical connectors within the through vias; and at least one external terminal disposed on a surface of the encapsulation layer, electrically coupled to one of the one or more bond pad terminals by an electrical connector in at least one of the plurality of through vias; wherein the encapsulation layer comprises one selected from the group consisting essentially of mold compound, spun on glass, spun on dielectric, polyimide, epoxy, resin, plastic, organic material and inorganic material. In another embodiment, the apparatus above further comprises a redistribution layer pattern in the encapsulation layer. In yet another embodiment of the apparatus, the first thickness of the encapsulation layer is at least 10 microns.

In yet another alternative embodiment, an apparatus for forming through vias in an encapsulation layer is provided comprising: an upper mold tool having a planar surface, a first plurality of pillars extending from the planar surface configured for imprinting through vias in an encapsulation layer, and having a central portion for a die cavity; a lower mold tool having a planar surface; and a mold equipment configured to receive the upper and lower mold tools. In another embodiment, the apparatus further comprises a second plurality of pillars extending from the planar surface of the upper mold tool for imprinting blind vias in the encapsulation layer. In yet another embodiment, the lower mold tool further comprises a die cavity cuboid positioned in correspondence to the die cavity portion. In yet a further embodiment, the first and second plurality of pillars are tapered with a wider portion adjacent the surface of the upper mold tool. In still another embodiment, the first and second plurality of pillars is coated with a non-stick material.

In a method embodiment, a method comprises providing a substrate having a first surface; covering the substrate with an encapsulation layer of uncured material; inserting an upper mold tool having a first plurality of pillars into the encapsulation layer to imprint through vias extending to the first surface of the substrate; curing the encapsulation layer and the through vias; removing the upper mold tool from the encapsulation layer; removing residue from the through vias; disposing conductor material within the through vias to make electrical connectors within the through vias; and forming external connectors over the encapsulation layer, at least one of the external connectors electrically coupled to the substrate by the conductor material of at least one of the through vias. In still another embodiment, the method further comprises providing an integrated circuit mounted on the first surface of the substrate covered by the layer of encapsulation material; and inserting the upper mold tool having a second plurality of pillars to form blind vias extending to a surface of the integrated circuit. In still another embodiment, the method comprises providing an integrated circuit mounted on the first surface of the substrate and covered by the layer of encapsulation material, the integrated circuit electrically coupled to bond pads on the substrate by micro-bump connections. In yet another embodiment, covering the substrate with the encapsulation layer comprises covering the substrate with a material selected from the group consisting essentially of mold compound, spun on glass, spun on dielectric, polyimide, epoxy, resin, plastic, inorganic material and organic material. In another alternative embodiment, the method comprises providing an integrated circuit as the substrate. In still another embodiment, the method comprises providing a lower mold tool having a cuboid projection in a central portion, and inserting the lower mold tool into the encapsulation layer to form a die cavity in an encapsulation layer. In a further embodiment, the method comprises patterning the upper mold tool to define a redistribution layer pattern, and forming a redistribution layer pattern in the encapsulation layer when the upper mold tool is inserted to form the through vias.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
   providing a substrate having a first surface;
   covering the first surface of the substrate with an encapsulation layer of uncured material;
   inserting an upper mold tool having a first plurality of pillars into the encapsulation layer to imprint through vias extending to the first surface of the substrate;
   curing the encapsulation layer and the through vias;
   removing the upper mold tool from the encapsulation layer; and
   disposing conductor material within the through vias to make electrical connectors within the through vias.

2. The method of claim 1 and further comprising:
   forming external connectors over the encapsulation layer.

3. The method of claim 2, wherein forming the external connectors comprises forming solder balls.

4. The method of claim 2, wherein forming the external connectors comprises forming solder bumps.

5. The method of claim 1, and further comprising forming a redistribution layer in the encapsulation layer.

6. The method of claim 1, wherein covering the substrate with the encapsulation layer comprises covering the substrate with a material selected from the group consisting essentially of mold compound, spun on glass, spun on dielectric, polyimide, epoxy, resin, plastic, inorganic material and organic material.

7. The method of claim 1, and further comprising:
   providing an integrated circuit mounted on the first surface of the substrate covered by the layer of encapsulation material; and
   inserting the upper mold tool having a second plurality of pillars into the encapsulation layer to imprint blind vias extending to a surface of the integrated circuit.

8. The method of claim 7 wherein providing the integrated circuit mounted on the first surface of the substrate further comprises mounting the integrated circuit in face to face relation to the first surface.

9. The method of claim 8, wherein the integrated circuit is mounted using solder bumps.

10. A method, comprising:
    providing a layer of uncured encapsulation material;
    inserting an upper mold tool having a first plurality of pillars into the encapsulation layer to imprint through vias extending through the encapsulation layer;
    curing the encapsulation layer and the through vias;
    removing the upper mold tool from the encapsulation layer; and
    disposing conductor material within the through vias to make electrical connectors within the through vias.

11. The method of claim 10, and further comprising:
    disposing a substrate having conductive pads over one surface of the encapsulation layer;
    forming external connectors on an opposing surface of the encapsulation layer; and
    electrically connecting at least one of the external connectors to at least one of the conductive pads using conductor material in at least one of the through vias.

12. The method of claim 11 wherein disposing the substrate having conductive pads further comprises disposing a substrate having conductive pads positioned in correspondence to the through vias in the encapsulation layer.

13. The method of claim 10 and further comprising:
    inserting a lower mold tool into the uncured encapsulation layer simultaneously with inserting the upper mold tool, the lower mold tool having a cuboid projection that forms a die cavity in the encapsulation layer; and
    after curing the encapsulation layer, removing the lower mold tool.

14. The method of claim 13, and further comprising disposing an integrated circuit into the die cavity in the encapsulation layer.

15. The method of claim 14 and further comprising electrically coupling the integrated circuit to a substrate positioned overlying the encapsulation layer.

16. A method comprising:
    providing a substrate having conductive pads for making electrical connections on a first surface;
    mounting an integrated circuit to the first surface of the substrate, the integrated circuit having bond pads for making electrical connections on an upper surface;
    disposing an uncured encapsulation layer over the first surface of the substrate and over the upper surface of the integrated circuit;
    positioning the substrate and the uncured encapsulation layer into a mold;
    inserting an upper mold tool into the encapsulation layer, the upper mold tool having a first plurality of pillars into the encapsulation layer to imprint through vias extending to the first surface of the substrate and having a second plurality of pillars to imprint blind vias extending to the bond pads of the integrated circuit;
    curing the encapsulation layer and the through vias and the blind vias;
    removing the upper mold tool from the encapsulation layer; and
    disposing conductor material within the through vias and the blind vias to make electrical connectors within the through vias and the blind vias; and
    forming external connectors over the encapsulation layer.

17. The method of claim 16, wherein disposing the uncured encapsulation layer further comprises disposing a material selected from the group consisting essentially of mold compound, spun on glass, spun on dielectric, polyimide, epoxy, resin, plastic, inorganic material and organic material.

18. The method of claim 17, wherein disposing conductor material within the through vias and the blind vias further comprises disposing conductor material selected from the group consisting essentially of electroplated copper and copper alloys.

19. The method of claim 16, and further comprising forming a redistribution layer in the encapsulation layer.

20. The method of claim 16 wherein forming external connectors further comprises forming solder balls over the encapsulation layer.

* * * * *